United States Patent
Kanga

(10) Patent No.: US 6,367,381 B1
(45) Date of Patent: Apr. 9, 2002

(54) LASER IMAGED PRINTING PLATES COMPRISING A MULTI-LAYER SLIP FILM

(75) Inventor: Rustom Sam Kanga, Marietta, GA (US)

(73) Assignee: Polyfibron Technologies, Inc., Atlanta, GA (US)

(*) Notice: Subject to any disclaimer, the term of this patent is extended or adjusted under 35 U.S.C. 154(b) by 0 days.

(21) Appl. No.: 09/507,840

(22) Filed: Feb. 22, 2000

(51) Int. Cl.[7] ............................. G03C 1/815; G03F 7/11
(52) U.S. Cl. ................... 101/395; 101/456; 430/273.1; 430/302; 430/306; 430/327
(58) Field of Search ................. 430/5, 271.1, 273.1, 430/302, 306, 309, 327, 328; 101/456, 467, 395, 401.1

(56) References Cited

U.S. PATENT DOCUMENTS

| | | | |
|---|---|---|---|
| 5,262,275 A | * 11/1993 | Fan | 430/306 |
| 5,354,633 A | 10/1994 | Lewis et al. | 430/5 |
| 5,387,496 A | 2/1995 | DeBoer | 430/322 |
| 5,429,909 A | 7/1995 | Kaszczuk et al. | 430/273 |
| 5,506,086 A | * 4/1996 | Van Zoeren | 430/306 |
| 5,649,486 A | * 7/1997 | Lewis | 101/453 |
| 5,719,009 A | * 2/1998 | Fan | 430/306 |
| 5,821,028 A | * 10/1998 | Maejima et al. | 430/201 |
| 5,925,500 A | * 7/1999 | Yang et al. | 430/300 |
| 6,020,108 A | * 2/2000 | Goffing et al. | 430/306 |

FOREIGN PATENT DOCUMENTS

| | | |
|---|---|---|
| EP | 0 454 083 A2 | 10/1991 |
| EP | 0 544 286 A1 | 6/1993 |
| EP | 0 636 491 A1 | 2/1995 |
| EP | 0 672 954 A2 | 9/1995 |
| EP | 0 687 567 A2 | 12/1995 |
| EP | 0 687 570 A1 | 12/1995 |

* cited by examiner

*Primary Examiner*—Stephen R. Funk
(74) *Attorney, Agent, or Firm*—Woodcock Washburn LLP

(57) ABSTRACT

The present invention provides a method of making a laser imaged printing plate. First, a solid, uncured printing plate is modified with both a UV absorber and an IR absorber. This is most conveniently done by constructing a multilayer slip film comprising at least two layers wherein at least one layer comprises a strong UV absorber, and wherein at least one other layer comprises an IR absorber having high absorptivity. The multilayer slip film is already adapted for use with a printing plate and is applied in the usual fashion to the surface of the uncured printing plate. The printing plate with the multilayer slip film can be stored for a time, or used immediately, as the printer's needs dictate. In use, the multilayer slip film is ablated from the photopolymer using an IR laser operating at a selected wavelength to create an in situ negative. The resulting negative can be subjected to typical UV flood exposure and development.

19 Claims, 2 Drawing Sheets

LASER IMAGED PRINTING PLATES COMPRISING A MULTI-LAYER SLIP FILM

FIELD OF THE INVENTION

This invention relates to printing plates that can be made without using a negative. More specifically, it relates to a laser-imageable printing plate. Such plates are particularly useful for flexographic printing, but can be used for offset and lithographic printing.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies.

Such plates offer a number of advantages to the printer, based chiefly on their durability and the case with which they can be made. Further improvements, to the degree of resolution (fineness of detail) which can be obtained as well as reductions in cost, would expand the usefulness of these plates. The present invention allows both increased resolution by use of laser processing, and reductions in cost through the elimination of the use of a negative to make the printing plate.

A typical flexographic printing plate as delivered by its manufacturer is a multilayered article made of, in order, a backing, or support layer; one or more unexposed photocurable layers; a protective layer or slip film; and a cover sheet. The backing layer lends support to the plate. It is typically a plastic film or sheet about 5 mils or so thick, which may be transparent or opaque. Polyester films, such as polyethylene terephthalate film, are examples of materials that can be suitably used as the backing. When only a single photocurable layer is present, it may be anywhere from about 25–275 mils thick, and can be formulated from any of a wide variety of known photopolymers, initiators, reactive diluents, fillers, etc. In some plates, there is a second photocurable layer (referred to as an "overcoat" or "printing" layer) atop this first, base layer of photocurable material. This second layer usually has a similar composition to the first layer, but is generally much thinner, being on the order of less than 10 mils thick. The slip film is a thin (about 0.1–1.0 mils) sheet which is transparent to UV light that protects the photopolymer from dust and increases its ease of handling. The cover sheet is a heavy, protective layer, typically polyester, plastic or paper.

In normal use, the printer will peel the cover sheet off the printing plate, and place a negative on top of the slip film. The plate and negative will then be subjected to flood-exposure by UV light through the negative. The areas exposed to the light cure, or harden, and the unexposed areas are removed (developed). Typical methods of development include washing with various solvents or water, often with a brush. Other possibilities for development include use of an air knife or heat plus a blotter.

Exposure of the printing plate is usually carried out by application of a vacuum to ensure good contact between the negative and the plate. Any air gap will cause deterioration of the image. Similarly, any foreign material, such as dirt and dust between the negative and the plate results in loss of image quality.

Even though the slip films are thin and made from transparent materials, they still cause some light scattering and can somewhat limit the resolution which can be obtained from a given image. If the slip film were eliminated, finer and more intricate images could be obtained. Finer resolution would be particularly desirable for the reproduction of elaborate writing as in the case of Japanese characters, and for photographic images.

A negative can be a costly item. For one thing, any negative which is used for printing must be perfect. Any minor flaw will be carried through onto each printed item. As a consequence, effort must be expended to ensure that the negative is precisely made. In addition, the negative is usually made with silver halide compounds which are costly and which are also the source of environmental concerns upon disposal.

Given these considerations, it is clear that any process which would eliminate the use of the negative, or reduce the light scattering effects and other exposure limitations of the slip films, would yield significant advantages in terms of cost, environmental impact, convenience, and image quality over the present methods.

The inventor has found a way to obtain these advantages by using a laser that is guided by an image stored in an electronic data file to create an in situ negative on a modified slip film, and then exposing and developing the printing plate in the usual manner. As a result, the printer need not rely on the use of negatives and all their supporting equipment, and can rely instead on a scanned and stored image. Such images can be readily altered for different purposes, thus adding to the printer's convenience and flexibility. In addition, this method is compatible with the current developing and printing equipment, so expensive alterations to the other equipment are not required.

Laser engraving of various materials, such as wood and metal, is well known. Laser engraving of cured hard rubber or lithographic plates is also known. If this procedure were applied to a flexographic printing plate, the plate would first be exposed to UV light without an image. Then the laser would be used to engrave an image on the hardened plate. This has been attempted, but found to be too slow to be commercially competitive. Flexographic printing plates require high relief (generally, 30–40 mil high letters) which take a long time to engrave.

Direct exposure of a photopolymer using a laser is also known. This procedure uses a precisely guided laser to replace the UV flood lamps which are normally used to expose the plate. U.S. Pat. No. 4,248,959, issued to Jeffers et al. Feb. 3, 1981, relates to the direct exposure of a photosensitive polymer plate using a laser guided by a computer-generated image. The disclosed method is not suitable for the development of flexographic printing plates, because the thickness of such plates hampers the cure. Again, the process is too slow to be commercially competitive.

Other efforts have focussed on generating an image directly in contact with a photocurable layer. U.S. Pat. No. 5,015,553 issued to Grandmont et al. May 14, 1991 relates to a method of making a UV photoresist for a printed circuit board, using a computer-assisted design (CAD) driven photoplotter which selectively exposes a photographic imaging layer without affecting the underlying UV sensitive photoresist. The image layer is then chemically developed on the board and used as an in situ mask for the underlying UV resist during exposure to UV light. After the exposure, the image layer is peeled off to allow conventional processing of the resist. The process requires at least two development steps for the entire plate, and also requires the use of a peelable cover sheet interposed between the image layer and the photocurable layer.

Laser ablation of polymers from relatively insensitive substrates is known. U.S. Pat. No. 4,020,762 issued to Peterson May 3, 1977 relates to a method of making a sensitized aluminum printing plate for offset lithography. An aluminum sheet was coated with a mixture of finely divided carbon, nitrocellulose, a non-oxidizing alkyd resin, a diazo sensitizer, cellulose acetate, butylacetate, xylene and ethyl cellosolve. The coating was at least partially etched with a YAG laser. It is not clear whether all the coating was removed from the aluminum substrate although the text alludes to this result. The patentee discloses that the etched areas became sensitive to UV light, and that the etched areas, after exposure to UV light and development, accepted ink, while the areas which were not etched accepted water. No quantitative results are presented. There is no indication that the liquid coating in the reference would be usable as a flexographic printing plate. There is no indication that the laser ablation was precise enough to allow removal of a polymer layer to uncover a photosensitive polymer layer directly beneath.

Laser ablation of polymers from sensitive substrates is also known. U.S. Pat. No. 5,925,500 issued to Yang, et al. Jul. 20, 1999 relates to a method of making a laser imaged printing plate utilizing an ultraviolet absorbing layer. Here, the negative was replaced by a slip-film doped with a UV absorber. The doped slip film was laminated to a photopolymer layer and was ablated from the photopolymer layer using a laser operating at a wavelength in the UV region, i.e., 300–400 nm. The resulting imaged UV absorber-doped layer effectively becomes the negative and can be subjected to typical UV flood exposure and development. Here, however, the disclosed method is not commercially practical because practicing the invention is limited to photo-ablation with a laser operating in the UV region. This type of laser is expensive, difficult to maintain, and the optics used in such lasers are unstable and easily damaged.

Lasers have also been used to physically transfer small amounts of polymer from one layer of a multilayer article to another. U.S. Pat. No. 5,156,938 issued to Foley et al. Oct. 30, 1992, relates to a method of laser-induced ablative transfer imaging suitable for the production of masks (negatives) for the graphic arts and printed circuit industries. In this process, a laser-sensitive material is physically displaced from a donor layer of a multilayer structure to a receptor layer. This is described as an ablative transfer because some of the materials from the donor layer are ablated while other materials are deposited on the receptor layer.

The inventors have discovered that if a multilayer slip film is constructed comprising at least two layers wherein at least one layer comprises a strong UV absorber, and wherein at least one other layer comprises an IR absorber having high absorptivity, a more stable IR laser that is readily available such as, for example, Nd-YAG lasers operating at 1064 nm, and diode array lasers operating at 830 nm, can be used to engrave the slip film. The IR absorber layer enables the slip film coating to ablate cleaner and easier while the UV absorber layer allows the slip film to effectively become a negative that is created in situ. There is no need to separately manufacture a negative, or to eventually dispose of silver halide. Also, the light scattering effects resulting from the presence of a separate conventional slip film underlying the negative are eliminated, thereby increasing resolution of the image.

BRIEF DESCRIPTION OF THE INVENTION

According to one embodiment, the present invention provides a laser-imageable and photocurable article comprising a backing layer, a photocurable layer disposed upon said backing, having a low absorptivity of radiation at a selected wavelength in the range of 300–400 nm and an initiator activatable at the selected wavelength, and a multilayer photoablative slip film. The layers of the multilayer slip film comprise a film-forming polymer and a self-oxidizing binder. In particular, at least one of the layers of the multilayer photoablative slip film comprises a UV absorber having high absorptivity in the wavelength range of 300–400 nm, and at least one other layer of the multilayer photoablative slip film comprises an IR absorber having high absorptivity at either the 830 nm wavelength or the 1064 nm wavelength. The multi layer photoablative slip film is capable of being photoablated by a laser operating at an energy level in the IR or near-IR wavelengths, and wherein unablated areas of the multilayer slip film are capable of absorbing substantially all irradiated light from an ultraviolet light source, such that areas of the photocurable layer under ablated areas of the multilayer photoablative slip film are cured, and areas of the photocurable layer under unablated areas of the multilayer photoablative slip film remain uncured, upon exposure of the article to an actinic radiation light source.

BRIEF DESCRIPTION OF THE DRAWINGS

The numerous objects and advantages of the present invention may be better understood by those skilled in the art by reference to the accompanying non-scale figures, in which.

DETAILED DESCRIPTION OF THE INVENTION

The Exposure and Development Process

Figure 1:
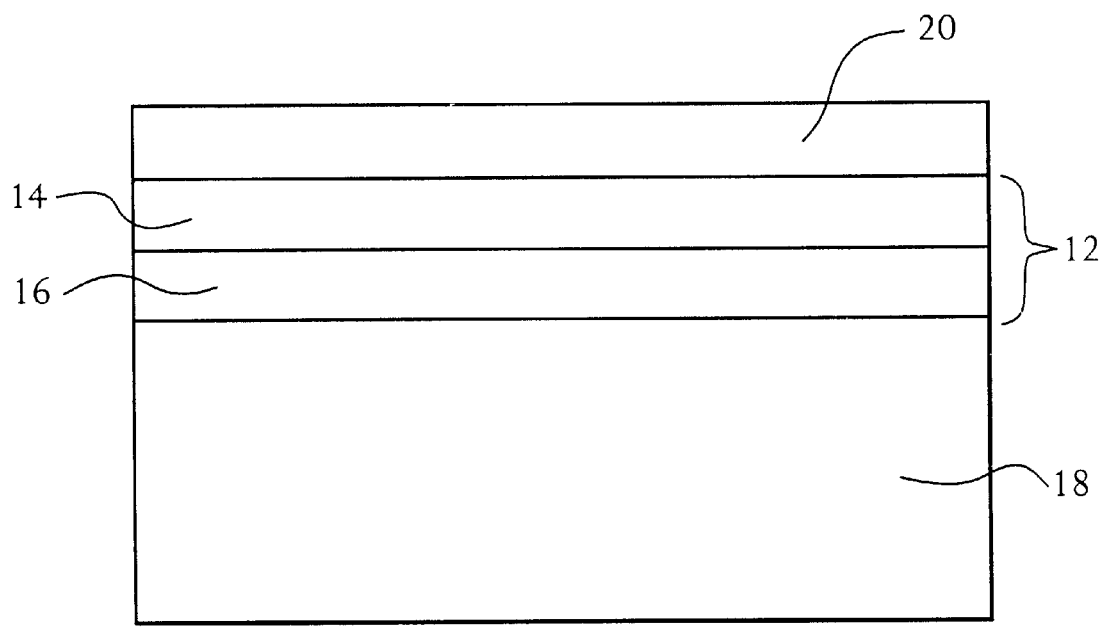
FIG. 1 is a cross-sectional view of a composite printing element according to the invention.

The present invention includes a method of making a laser imaged printing plate. First, a solid, uncured printing plate is modified with both a UV absorber and an IR absorber. This is most conveniently done by constructing a multilayer slip film comprising at least two layers wherein at least one layer comprises a strong UV absorber, and wherein at least one other layer comprises an IR absorber. Preferably, both the UV and IR absorbers have a high absorptivity in their respective wavelengths. The multilayer slip film is already adapted for use with a printing plate and is applied in the usual fashion to the surface of the uncured printing plate. The printing plate with the multilayer slip film can be stored for a time, or used immediately, as the printer's needs dictate.

When the printing plate is to be used, a laser operating at a wavelength in the IR region is typically employed to selectively ablate, or remove, the multilayer slip film. The uncured plate is then flood-exposed to UV light in the usual fashion. The areas where the multilayer slip film was ablated will cure, or harden, upon exposure to the UV light. The areas where the multilayer slip film was not ablated will remain uncured. The uncured areas can then be washed away in the normal development process.

This application is written in terms of the specific embodiment in which the invention was first applied, that is, flexographic printing plates. One of ordinary skill in the art will readily recognize that this invention is not limited to this embodiment. For example, in this invention the multilayer slip film is used as a carrier for the UV and IR absorbers. This is a matter of convenience, as the slip film was already available in the existing plates for use. Similarly, a UV and IR transparent film which has been doped with a UV absorber and an IR absorber and ablated by a laser operating at a selected IR or near-IR wavelength could be used as the printing sleeve for gravure printing, or as an in situ mask for making photoresists.

The UV Absorber

One important aspect of the present invention is that the multilayer slip film, which would normally be transparent to UV light in order to facilitate the imaging process, is modified with a layer comprising a UV absorber. The presence of the UV absorber makes a normally UV transparent slip film into a highly UV opaque barrier. It is critical that the UV absorption be nearly complete, at least 95%, preferably more than 97%, more preferably more than 99.9%, and most preferably more than 99.99%, so that substantially all the radiation from the UV flood-exposure lamps will be blocked. The spectral range of the flood-exposure lamps used in most applications is 300–400 nm. Therefore the UV absorber typically should be active in this range. An alternative way of stating this is to say that the UV absorber must have high absorptivity in the spectral output range of the developer lamps.

The intensity of flood exposure lamps used in the curing of flexographic printing plates is typically in the range of about 5–25 milliwatts/cm$^2$, but intensities can be as high as 50 milliwatts/cm$^2$. Therefore, the slip film, in all unablated areas, should be capable of absorbing substantially all irradiated light of such intensities from the UV flood lamps.

Benzophenone derivatives and strongly absorbing dyes are favored. The following materials have high absorptivity within the typical spectral range of developer lamps:

TABLE 1

Absorptivity (L/g/Cm of Various UV Absorbers

| Compound | λmax, nm | Absorptivity (a) L*(g)$^{-1}$*(Cm)$^{-1}$ | Commercial Source |
|---|---|---|---|
| UVINUL 3050 | 350 | 65.74 | BASF |
| T-112 | 390 | 40.79 | Esprit Chemical Company |
| MS40 | 326 | 30.42 | American Dye Source |
| 3V-SV | 339 | 72.55 | Sigma Aldrich |
| UV 20H | 324 | 51.52 | Sigma Aldrich |
| UV 531 | 324 | 51.52 | Cytec Industries |
| STILBENE | 364 | 181.6 | Lambdachrome |

The UV absorber must also be compatible with the slip film, and not exhibit significant migration from the slip film to the photocurable composition. Preferably, the UV absorber is soluble in polymeric materials that form the slip film.

Preferred UV-absorbers which have been found to have these characteristics are UVINUL 3050 (BASF), coupling products of dimethyl amino benzene with hydroxy biphenyl, commercially available from Esprit Chemical Co., Sarasota, Fla., and STILBENE, commercially available from Lambdachrome, Inc., Fort Lauderdale, Fla. The UV absorber is typically present in the film in amounts of about 1 to about 50%, more preferably about 6 to about 30%, most preferably about 10 to about 20% by weight. The UV absorber layer can have a thickness (in micrometers, μm) of from about 0.25 μm to 50.8 μm, preferably from about 0.51 μm to 25.4 μm, more preferably from about 0.76 μm to 12.7 μm, and most preferably from about 0.89 μm to 7.6 μm.

The IR Absorber

Another important aspect of the present invention is that the multilayer slip film has a layer that is modified with an IR-absorbing compound. Preferably, this layer is separate from, and in addition to, the UV absorber layer. The presence of the IR absorber layer makes the multilayer slip film more sensitive to the IR laser.

The IR absorber must exhibit a specific response to excitation by laser at an appropriate wavelength, i.e., it must allow the ablation of the slip film. Preferably, the IR absorber has a maximum absorbance at the wavelengths of the IR plate-setter used. This is typically either at about 830 nm in the near-IR range or about 1064 nm in the IR-range—but not at both. Therefore the IR absorber typically should be active at these wavelengths. An alternative way of stating this is to say that the IR absorber must have high absorptivity in the spectral output range of the laser.

Preferably, the IR absorber is an IR-absorbing dye. More preferably, the IR-absorbing dye is one of the dyes listed in the following table:

TABLE 2

Absorptivity (L/g/Cm) of Various Dyes for 830 and 1064 nm

| Dye | λmax, NM | Absorptivity (a) L* (g)$^{-1}$*(Cm)$^{-1}$ | Commercial Source |
|---|---|---|---|
| ADS 830 | 819.0 | 322.98 | American Dye Source |
| ADS 1 | 833.5 | 163.46 | American Dye Source |
| ADS 2 | 851.0 | 319.43 | American Dye Source |
| ADS WS | 842.0 | 287.3 | American Dye Source |
| PROJET 830 NP | 812.0 | 45.5 | Zeneca |
| NK-4432 | 821.0 | 369.56 | Hayashibara |
| IR-26 | 1080.0 | 145.07 | Lambdachrome |
| PROJET S174270 | 1090.0 | 131.25 | Zeneca |

The IR absorber is typically present in the film in amounts of from about 1 to about 25%, preferably from about 5 to about 20%, more preferably from about 7 to about 18%, and most preferably from about 7 to about 15% by weight. The IR absorber layer can have a thickness of from about 0.025 μm to about 12.7 μm, preferably from about 0.25 μm to about 10.2 μm, more preferably from about 0.38 μm to about 7.6 μm, and most preferably from about 0.51 μm to about 5.1 μm.

The Multilayer Slip Film

As discussed above, the preferred vehicle for the UV and IR absorbers in some embodiments of the present invention is a multilayer slip film layer. The multilayer slip film is a thin, multilayer protective film used with a printing plate that is to be imaged. According to the present invention, a typical multilayer slip film, to which the UV and IR absorbers are respectively added, comprises layers comprising a self-oxidizing binder, a film-forming polymer and/or a low molecular weight plasticizer. Self-oxidizing binders typically impart enhanced ablative sensitivity to the slip film. Preferably, the film-forming polymer and the self-oxidizing binder are compatible with each other and with the UV and IR absorber such that the resultant film or layers thereof will not be hazy or opaque.

The self-oxidizing binder is typically the major component of the multilayer slip film. Preferred self-oxidizing elastomeric binders include nitrocellulose, polycarbonates, polyvinylpyrrolidone, poly(vinylpyrrolidone-co-vinyl acetate), polyesters, polyorthoesters, polyacetals, ethylcellulose, and carboxymethylcellulose. Nitrocellulose is particularly preferred.

The use of the self-oxidizing binder is preferred as long as the final multilayer slip film does not "crack" or show a "mottled" appearance; a brittle layer can result if too much of the self-oxidizing binder is used in the final composition of the layer. Accordingly, a low molecular weight plasticizer, such as, for example, polyisoprene, polybutadiene, polyolefins, and low molecular weight polyamides may be added to make the layer more elastic. In this regard, the optimum amount of self-oxidizing binder to include in a layer of the multilayer slip film will vary from as low as about 20% to as high as about 85%. When used in conjunction with a film-forming polymer, a preferred concentration of the self-oxidizing binder is from about 30 to about 50% by weight. When used in conjunction with a low molecular weight plasticizer, a preferred concentration of the self-oxidizing binder is from about 50 to about 85% by weight.

The film-forming polymer component can be present in each layer of the multilayer slip film at from about 1 to about 50 percent by weight, more preferably from about 1.5 to about 30 percent by weight, and most preferably from about 2 to about 25 percent by weight. The film-forming polymer component can be any film-forming polymer known to those skilled in the art that is compatible with the underlying photopolymer and easily removed during the development (wash) step. Such film-forming polymers are well known in the photo-processing field. Examples include polyacetals, polyacrylics, polyamides, polyimides, polybutylenes, polycarbonates, polyesters, polyethylenes, cellulosic polymers, polyphenylene ethers, polyethylene oxides, natural or synthetic polymers of conjugated diolefin hydrocarbons, including polyisoprene, 1,2-polybutadiene, 1,4-polybutadiene, butadiene/acrylonitrile, polyvinyl alcohol, polyvinyl acetate, hydroxypropylcellulose, butadiene/styrene thermoplastic-elastomeric block copolymers, and other copolymers. Cellulosics and polyamides are preferred for ease of ablation. Low molecular weight polyamides are especially preferred.

In principle, any such film-forming polymer may be modified by adding the UV and IR absorbers of the present invention.

The multilayer slip film may also comprise a contrast dye to create a contrast between the imaged and non-imaged areas. Examples of such contrast dyes can be found, for example, in U.S. Pat. No. 5,387,496 to DeBoer, U.S. Pat. No. 5,429,909 to Kaszczuk et al., and U.S. Pat. No. 5,354,633 to Lewis et al., all of which are herein incorporated by reference.

As described above, the addition of the IR absorber layer can change the slip film's response to the laser used in the present invention. For example, single-layer films doped with a UV absorber only such as, for example, those disclosed is U.S. Pat. No. 5,925,500, incorporated herein by reference, are not normally affected by exposure to laser radiation at 830 nm or 1064 nm, but when at least one additional layer comprising an IR absorbing dye is added to form a multilayer slip film, the film becomes vulnerable to IR-laser ablation, and useful in the present process.

According to the present invention, the UV absorber and the IR absorber can also be incorporated into a single layer of a slip film. The inventor has found, however, that, in some cases where the UV absorber and the IR absorber were incorporated into a single layer of the slip film, the resulting film was hazy. Accordingly, it was found that separating the UV and IR absorbers into separate layers produced a surprisingly superior system.

Preferably, the thickness of the multilayer slip film is from about 0.025 μm to about 20 μm, most preferably the thickness of the multilayer slip film is from about 0.50 μm to about 5.0 μm, most preferably, the thickness of the multilayer slip film is no more than 2.0 μm.

The multilayer slip film can be constructed by any method known to those skilled in the art. Such methods include extrusion die coating, tandem rod coating, tandem ring coating, and tandem gravure coating.

The Photocurable Layer

The photocurable layer, which generally has a thickness of from about 0.02 to 0.35 inches, comprises a photocurable composition. In principle, any of the known photocurable compositions can be used in the present invention. Typically, such photocurable compositions include a photocurable material and an initiator. In addition, such photocurable compositions can also include a variety of known reactive diluents, fillers, and dyes. Preferably, the photocurable material, initiator, and other various additives of the photocurable composition have a low absorptivity at the laser's operating wavelength, i.e., has a low absorbance of radiation at IR or near-IR wavelengths. If the photocurable material has a high absorbance of radiation at IR or near-IR wavelengths, heat damage to the polymer can result.

Preferred photocurable compositions include an elastomer compound, an ethylenically unsaturated compound having at least one terminal ethylenic group, and a photoinitiator. Exemplary photocurable compositions arc disclosed in European Patent Applications 0 456 336 A2 (Goss, et al.) and 0 640 878 A1 (Goss, et al.), British Patent No 1,366,769, and U.S. Pat. No. 5,223,375 (Berrier, et al.), U.S. Pat. No. 3,867,153 (MacLahan), U.S. Pat. No. 4,264,705 (Allen), U.S. Pat. No. 4,265,986 (Allen), U.S. Pat. No. 4,323,636 (Chen, et al.), U.S. Pat. No. 4,323,637 (Chen, et al.), U.S. Pat. No. 4,369,246 (Chen, et al.), U.S. Pat. No. 4,423,135 (Chen, et al.), and U.S. Pat. No. 3,265,765 (Holden, et al.), U.S. Pat. No. 4,320,188 (Heinz, et al.), U.S. Pat. No. 4,427,759 (Gruetzmacher, et al.), U.S. Pat. No. 4,460,675 (Gruetzmacher, et al.), U.S. Pat. No. 4,622,088 (Min), and U.S. Pat. No. 5,135,827 (Bohm, et al.), which are incorporated herein by reference. If a second photocurable layer is used, i.e., an overcoat layer, it typically is disposed upon the first and is similar in composition but considerably thinner, usually less than 0.01 inches.

The photocurable materials of the invention should crosslink (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

Suitable initiators for the photocurable composition include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e., IRGACURE 651 (available from Ciba-Geigy, Hawthorne, N.Y.); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators.

Benzophenone-based initiators are preferred. An example of a preferred commercially available benzophenone-based initiator is IRGACURE 651 (Ciba Specialty Chemicals, Tarrytown, N.Y.).

Overcoat Layer

It is often preferred to provide a second photocurable layer disposed atop the photocurable layer so as to be situated in the final flexographic printing plate between the photocurable layer and the multi-layer slip film. When present, this overcoat layer becomes the actual printing layer of the finally-exposed plate. The composition of the overcoat layer can be the same or different as that of the base layer. Preferably, the overcoat layer, like the photocurable composition, has a low absorptivity at the laser's operating wavelength and is, thus, unaffected by the laser, i.e., insensitive to the laser at the wavelength employed. The thickness of the overcoat layer is generally less than that of the base layer, being on the order of about 1–10 mils, preferably about 2–8 mils. The overcoat layer is generally co-extensive with the photocurable layer and the two layers are directly in contact at their interface. In use of the plate, the two layers are photoexposed and developed simultaneously; that is, a single imagewise exposure is used and all layers are developed at the same time using a common developer solvent treatment. The use of overcoat layers and their incorporation into multi-layer flexographic printing plates are described, for example, in U.S. Pat. Nos. 5,370,968 and 4,460,675, the disclosures of which are hereby incorporated by reference.

The Laser

A laser is employed to precisely remove selected areas of the slip film, thereby allowing exposure of the photopolymer underneath to subsequent flood irradiation by UV lamps, and resulting cure of the photopolymer. The wavelength and power of the laser should be such that the laser treatment can ablate the slip film without damage to the photopolymer layer just beneath. Preferably, the laser is an IR-type laser such as, for example, Nd-YAG lasers typically operating at a wavelength of about 1064 nm; and diode array lasers typically operating at a wavelength of about 830 nm. Preferred laser systems include, for example, the Creo THERMOFLEX (Creo Products, Burnaby, British Columbia) or the Barco CDI (Barco Graphics, Vandalia, Ohio).

According to the operation of invention, the IR-absorbing dye is chosen such that it has high absorptivity at the wavelength that the laser is operating. When the slip film is doped with an IR-absorbing dye that has high absorptivity at the wavelength that the laser is operating, the coating ablates cleaner (without smoke) and faster than that without such a dye.

The following examples illustrate the present invention without limiting it, or the claims which follow.

EXAMPLE 1

Preparation of UV Absorber Modified Polyamide Slip Film For Flexographic Plates:

A conventional slip film was modified with a UV absorber to make the film opaque to actinic radiation. Nitrocellulose, a self-oxidizing binder, was also added to increase the sensitivity of the mask to laser ablation. The mask used had the approximate composition in the dry film seen in Table 3.

TABLE 3

| | Composition of the UV Mask | |
|---|---|---|
| Material | Weight % (Solution) | Weight % (Dry) |
| UVINUL 3050 (5% ethanol) | 39.5 | 19.6 |
| RS Nitrocellulose (10% solvent mixture) | 49.4 | 49.1 |
| VERSAMID 744 (30% nBuOH) | 8.90 | 26.4 |
| INGRASPERSE Black R-U (23%) | 2.11 | 4.9 |
| TOTAL | 100 | 100 |

The above formulation was hand cast on a clear PET coversheet such as MELINEX 453 available from Du Pont PET, Hopewell, Va., to obtain a film of approximately 2–4 μm thick (dry). A conventional FLEX-LIGHT KOR 0.067" plate (Polyfibron Technologies, Atlanta, Ga.) was then modified by carefully removing the slip film with isopropanol. The plate was then dried and then laminated with the above UV mask. The doped slip film absorbed 99.9% of actinic radiation as measured by a Model IL1400A light meter commercially available from International Light, Inc., Newburyport, Mass. In addition, a contrast dye was added to the mask to allow image contrast of the laser-imaged plate.

After lamination, the coversheet was removed and discarded, leaving the UV mask on the photo-polymer surface. The plate was mounted on a commercially available flexo plate-setter such as Misomex's OMNISETTER 4000 or Creo's THERMOFLEX 5280. The digital file from the computer was transferred onto the UV mask. It was observed that the laser had no effect on the UV mask (no ablation took place) and no image was delineated during the above exercise.

EXAMPLE 2

Preparation of UV Absorber and IR Absorber Modified Polyamide Slip Film for Flexographic Plates:

ADS 830 A, an IR-absorbing dye available from American Dye Source, Montreal, Canada, was added to the UV-absorber-modified mask of Example 1. Once again, the mask was absorbed 99.9% of actinic radiation. With the addition of the IR-absorbing dye, the mask became sensitive to IR lasers operating at about 830 nm, the wavelength typically employed in Flexo plate-setters. The mask used had the approximate composition in the dry film seen in Table 4:

TABLE 4

Composition of the UV/IR Mask

| Material | Weight % (Solution) | Weight % (Dry) |
|---|---|---|
| ADS 830 A (2% solvent) | 30.34 | 7.0 |
| UVINUL 3050 (5% ethanol) | 31.55 | 18.2 |
| RS Nitrocellulose (10% solvent mixture) | 24.27 | 45.6 |
| VERSAMID (744) (30% nBuOH) | 12.13 | 24.6 |
| INGRASPERSE Black R-U Dye (23%) | 1.71 | 4.6 |
| TOTAL | 100 | 100.0 |

Films approximately 2–4 $\mu$m thick (dry) were hand cast from the solution of Table 4, on a clear PET coversheet such as MELINEX 453 available from Du Pont PET, Hopewell, Va. A FLEX-LIGHT KOR 0.067" plate (Polyfibron Technologies, Atlanta, Ga.) was modified by removing the slip film using isopropanol followed by lamination with the above UV/IR mask.

After lamination, the coversheet was removed and discarded, leaving the mask on the photo-polymer surface. The plate was mounted on a commercially available flexo plate-setter such as Misomex's OMNISETTER 4000 or Creo's THERMOFLEX 5280. The digital file from the computer was transferred onto the above mask through an ablative on/off mechanism. The areas where the laser was "on," the mask were removed leaving an in situ photo-tool on the plate surface. The plate was then back exposed for 17 seconds, face exposed for 9 minutes to hold 1% dots at 133 LPI.

Although, the UV/IR mask was effective to make a DTP plate, there were several drawbacks seen with this approach. It was observed that the presence of both UV absorbers and IR absorbing dyes in a single layer resulted in compatibility problems evidenced by a hazy and uneven film.

EXAMPLE 3

Figure 2:
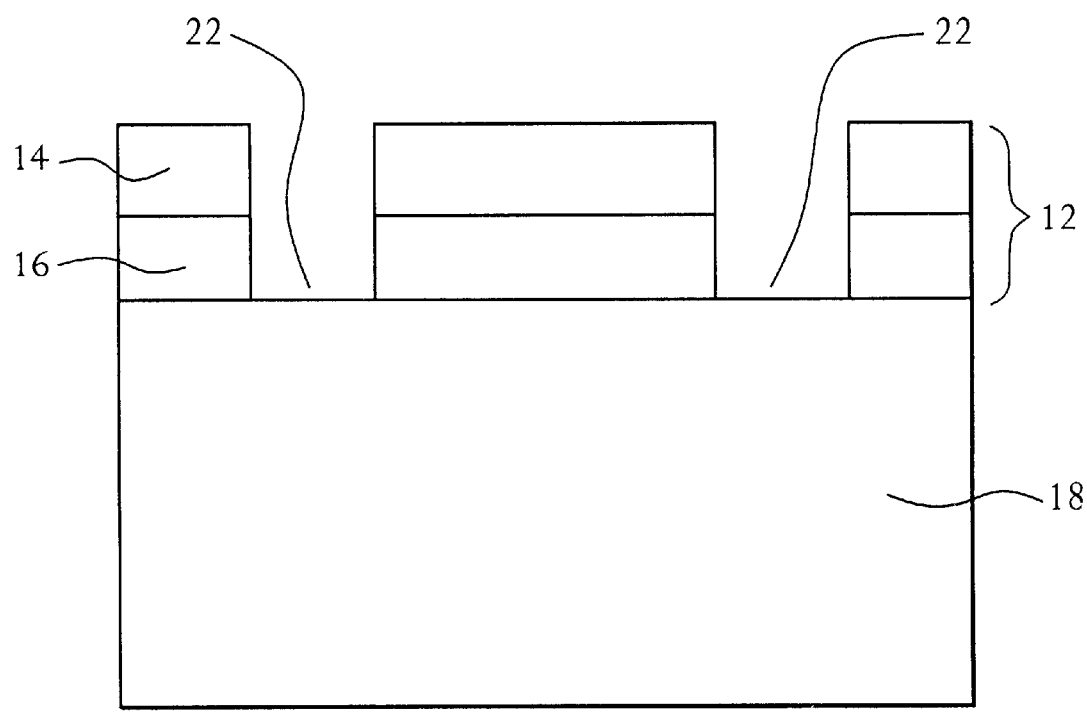
FIG. 2 is a cross-sectional view of the composite printing element of FIG. 1 after laser-ablation.

Preparation of a Multi-layered Mask Coating for Flexographic Plates:

To overcome the shortcomings described in the Example 2, a multi-layered coating was employed as the slip film. Referring now to FIGS. 1–2, the multilayer slip film 12 comprises of an ultraviolet-absorbing layer 14 and an infrared-absorbing layer 16. The ultraviolet-absorbing layer 14 absorbs 99.9% of actinic ultraviolet radiation. The ultraviolet-absorbing layer 14 had the approximate composition in the dry film seen in Table 5 and approximate thickness of 1–1.5 $\mu$m. The infrared-absorbing layer 16 was underneath the ultraviolet-absorbing layer 14 and adjacent to the photocurable layer 18. Infrared-absorbing layer 16 was designed to be sensitive to IR lasers operating at 830 nm, the wavelength typically employed in Flexo plate-setters. The presence of a contrast dye in the UV-absorbing layer 14, allowed image contrast of the final laser-imaged plate. The infrared-absorbing layer 16 had the approximate composition in the dry film seen in Table 6 and approximate thickness of 0.5–0.75 $\mu$m.

TABLE 5

Composition of the UV-Absorbing Layer

| Material | Weight % (Solution) | Weight % (Dry) |
|---|---|---|
| T-112 Yellow dye (5% in 1:1 ethanol:MEK) | 42.7 | 18.4 |
| RS Nitrocellulose (6C-419) paste (23% in Solvent Mix) | 26.0 | 51.5 |
| RS Nitrocellulose (6C-969) paste (10% in Solvent Mix) | 26.5 | 22.9 |
| INGRASPERSE Black R-U Dye (23%) | 2.5 | 5.0 |
| VERSAMID 115 (11.5% in nBuOH) | 2.3 | 2.3 |
| TOTAL | 100 | 100 |

TABLE 6

Composition of the IR-Absorbing Layer

| Material | Weight % (Solution) | Weight % (Dry) |
|---|---|---|
| ADS 830 A (2.0% in Butanol) | 62.2 | 15.3 |
| RS Nitrocellulose (6C-419) paste (23% in Solvent Mix) | 18.7 | 58.7 |
| RS Nitrocellulose (6C-969) paste (10% in Solvent Mix) | 19.1 | 26.1 |
| TOTAL | 100 | 100 |

The ultraviolet-absorbing layer 14 was hand coated onto a clear PET coversheet 20 such as, for example, MELINEX 453 available from Du Pont PET, Hopewell, Va. After the above coating was dry, the infrared-absorbing layer 16 was over-coated with the approximate thickness and composition mentioned above, thus forming the multi-layer slip film 12. A FLEX-LIGHT KOR 0.067" plate (Polyfibron Technologies, Atlanta, Ga.) was modified by carefully removing the slip film with isopropanol. The plate was then dried and then laminated with the above multilayer slip film 12.

After lamination, the coversheet 20 was removed and discarded, leaving the multilayer slip film 12 on the photocurable layer 18. The plate was mounted on a commercially available flexo plate-setter such as Misomex's OMNISETTER 4000 or Creo's THERMOFLEX 5280. The digital file from the computer was transferred onto the multilayer slip film through an ablative on/offmechanism. In the areas where the laser was "on" 22, both the IR-absorbing layer 16 and the over-lying UV-absorbing layer 14 were removed. Thus, an in situ photo-tool was created on the plate surface. The plate was then back exposed for 17 seconds, face exposed for 9 minutes to hold 1% dots at 133 LPI.

It was observed that, by separating the UV-absorbing function from the IR-absorbing function, a superior system was created. Each individual coating was clear and easy to coat. Surprisingly, the ablation of the IR-absorbing layer, the layer closest to the photo-polymer, also promoted the complete removal of the UV-absorbing layer. Thus, problems of clean-out were avoided, further helping in giving a low $D_{min}$. In addition, it was observed that the IR-absorbing layer, positioned between the UV-absorbing layer and the photocurable layer, prevented migration of the UV absorber into the photocurable layer.

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A laser-imageable and photocurable article comprising:
   a) a backing;
   b) a photocurable layer disposed upon said backing, said photocurable layer having a low absorptivity of radiation at a selected wavelength in the range of 300–400 nm and an initiator activatable at the selected wavelength; and
   c) a multilayer photoablative slip film, said layers of said multilayer photoablative slip film comprising a film-forming polymer and a self-oxidizing binder,
   wherein at least a first layer of said multilayer photoablative slip film comprises a UV absorber having high absorptivity in the wavelength range of 300–400 nm, said at least a first layer being substantially transparent to IR radiation,
   wherein at least a second layer of said multilayer photoablative slip film comprises an IR absorber having high absorptivity at either the 830 nm wavelength or the 1064 nm wavelength, and
   wherein said multilayer photoablative slip film is capable of being photoablated by a laser operating at an energy level in the IR or near-IR wavelengths, and wherein unablated areas of said multilayer photoablative slip film are capable of absorbing substantially all irradiated light from an ultra-violet light source, such that upon exposure of said article to an actinic radiation light source, areas of said photocurable layer under ablated areas of said multilayer photoablative slip film are cured, and areas of said photocurable layer under unablated areas of said multilayer photoablative slip film remain uncured.

2. The article of claim 1 wherein unablated areas of said multilayer photoablative slip film are capable of absorbing at least 97% of irradiated ultra-violet light in the range of 300–400 nm.

3. The article of claim 1, wherein the film-forming polymer is selected from the group consisting of polyacetals, polyacrylics, polyamides, polyimides, cellulosic polymers, polybutylenes, polycarbonates, polyesters, polyethylene, polyphenylene ethers, polyphenylene oxides, isoprene, 1,2-polybutadiene, 1,4-polybutadiene, butadiene/acrylonitrile, polyvinyl alcohol, polyvinyl acetate, and butadiene/styrene thermoplastic-elastomeric block copolymers.

4. The article of claim 1 further comprising a photocurable overcoat layer disposed between said photocurable layer and said multilayer photoablative slip film, said overcoat layer having a low absorptivity of radiation at the selected wavelength and an initiator activatable at the selected wavelength.

5. The article of claim 1 wherein said IR absorber is a dye.

6. The article of claim 5 wherein said multilayer photoablative slip film further comprises a low molecular weight plasticizer.

7. The article of claim 6 wherein said low molecular weight plasticizer is selected from the group consisting of polyisoprene, polybutadiene, and low molecular weight polyamides.

8. The article of claim 7 wherein said plasticizer is a low molecular weight polyamide.

9. The article of claim 1 wherein said self-oxidizing elastomeric binder is selected from the group consisting of nitrocellulose, polycarbonates, polyvinylpyrrolidone, poly(vinylpyrrolidone-co-vinyl acetate), polyesters, polyorthoesters, polyacetals, ethylcellulose, and carboxymethylcellulose.

10. The article of claim 1 wherein said photoablative slip film further comprises a contrast dye.

11. A method of making a laser imaged printing plate comprising the steps of:
    providing an article according to claim 1;
    photoablating said multilayer photoablative slip film using a laser operating at an energy level in the IR or near-IR wavelength thereby providing ablated and unablated areas, forming an in situ negative image;
    flood-exposing said article to UV light in the wavelength range of 300–400 nm, without a negative, thereby curing the photocurable layer in areas under ablated areas of said multilayer photoablative slip film to form a laser-imaged printing plate; and
    removing uncured polymer from under unablated areas of said multilayer photoablative slip film.

12. The method of claim 11 wherein unablated areas of said multilayer photoablative slip film are capable of absorbing at least 97% of irradiated ultra-violet light in the range of 300–400 nm.

13. The method of claim 11, wherein the film-forming polymer is selected from the group consisting of polyacetals, polyacrylics, polyamides, polyimides, cellulosic polymers, polybutylenes, polycarbonates, polyesters, polyethylene, polyphenylene ethers, polyphenylene oxides, isoprene, 1,2-polybutadiene, 1,4-polybutadiene, butadiene/acrylonitrile, polyvinyl alcohol, polyvinyl acetate, and butadiene/styrene thermoplastic-elastomeric block copolymers.

14. The method of claim 11 wherein said photocurable article further comprises a photocurable overcoat layer disposed between said photocurable layer and said multilayer photoablative slip film, said overcoat layer having a low absorptivity of radiation at the selected wavelength and an initiator activatable at the selected wavelength.

15. The method of claim 14 wherein said multilayer photoablative slip film further comprises a contrast dye.

16. The method of claim 11 wherein said IR-absorber is a dye.

17. The method of claim 11 wherein said UV-absorber is a benzophenone derivative.

18. A laser-imageable and photocurable article comprising:
    a) a baking;
    b) a photocurable layer disposed upon said backing, said photocurable layer having a low absorptivity of radiation at a selected wavelength in the range of 300–400 nm and an initiator activatable at the selected wavelength, and
    c) a multilayer photoablative slip film, said layers of said multilayer photoablative slip film comprising a film-forming polymer and a self-oxidizing binder, wherein said multilayer photoablative slip film comprises:
       a UV-absorbing layer comprising a UV absorber having high absorptivity in the wavelength range of 300–400 nm, said UV-absorbing layer being substantially transparent to IR radiation,
       an IR-absorbing layer positioned between said photocurable layer and said UV-absorbing layer, comprising an IR absorber having high absorptivity at either the 830 nm wavelength or the 1064 nm wavelength, and wherein said multilayer photoablative slip film is capable of being photoablated by a laser operating at an energy level in the IR or near-IR wavelengths, and wherein unablated areas of said multilayer photoablative slip film are capable of absorbing substantially all irradiated light from an ultra-violet light source, such that upon exposure of said article to an actinic radiation light source, areas of said photocurable layer under ablated areas of said multilayer photoablative slip film are cured, and areas of said photocurable layer under unablated areas of said multilayer photoablative slip film remain uncured.

19. A method of making a laser imaged printing plate comprising the steps of:

providing an article according to claim 18;

photoablating said multilayer photoablative slip film using a laser operating at an energy level in the IR or near-IR wavelength thereby providing ablated and unablated areas, forming an in situ negative image;

flood-exposing said article to UV light in the wavelength range of 300–400 nm, without a negative, thereby curing the photocurable layer in areas under ablated areas of said multilayer photoablative slip film to form a laser-imaged printing plate; and removing uncured polymer from under unablated areas of said multilayer photoablative slip film.

* * * * *